(12) United States Patent
Clube et al.

(10) Patent No.: US 8,524,443 B2
(45) Date of Patent: Sep. 3, 2013

(54) METHOD AND APPARATUS FOR PRINTING A PERIODIC PATTERN WITH A LARGE DEPTH OF FOCUS

(75) Inventors: Francis S. M. Clube, Neuchatel (CH); Christian Dais, Turgi (CH); Harun H. Solak, Brugg (CH)

(73) Assignee: Eulitha A.G., Villigen PSI (CH)

( * ) Notice: Subject to any disclaimer, the term of this patent is extended or adjusted under 35 U.S.C. 154(b) by 395 days.

(21) Appl. No.: 12/831,337

(22) Filed: Jul. 7, 2010

(65) Prior Publication Data
US 2012/0009525 A1 Jan. 12, 2012

(51) Int. Cl.
*G03F 7/20* (2006.01)

(52) U.S. Cl.
USPC ........................................ 430/322

(58) Field of Classification Search
USPC ................................. 430/322, 325
See application file for complete search history.

(56) References Cited

U.S. PATENT DOCUMENTS
4,360,586 A 11/1982 Flanders et al.
2008/0186579 A1 8/2008 Solak

OTHER PUBLICATIONS

Zanke et al., "Large area patterning for photonic crystals via coherent diffraction lithography", J. Vac. Sci. Technol. B 22 (2004), pp. 3352-3355.
Guerineau et al., "Talbot experiment re-examined: demonstration of an achromatic and continuous self-imaging regime", Opt. Commun. 180 (2000), pp. 199-203.
Solak et al., "Achromatic Spatial Frequency Multiplication: A Method for Production of Nanometer-Seale Periodic Structures", J. Vac. Sci. Technol., 23 (2005), pp. 2705-2710.
Unpublished U.S. Appl. No. 12/706,081, Solak et al.

*Primary Examiner* — Brittany Raymond
(74) *Attorney, Agent, or Firm* — Laurence A. Greenberg; Werner H. Stemer; Ralph E. Locher

(57) ABSTRACT

A method for printing a desired pattern into a photosensitive layer that includes providing a mask bearing a pattern of linear features that are parallel to a first direction, arranging the layer parallel to and separated from said mask, generating substantially monochromatic light, and illuminating the mask pattern with said light over a range of angles of incidence in a plane parallel to said first direction, at substantially a single angle in an orthogonal plane of incidence and so that the light of each angle of incidence transmitted by the mask forms a light-field component at the layer whereby the integration of said components prints the desired pattern, wherein the range of angles is selected so that the integration of said components is substantially equivalent to an average of the range of transversal intensity distributions formed between Talbot image planes by light at one of the angles of incidence.

19 Claims, 11 Drawing Sheets

METHOD AND APPARATUS FOR PRINTING A PERIODIC PATTERN WITH A LARGE DEPTH OF FOCUS

CROSS-REFERENCE TO RELATED APPLICATIONS

Not Applicable

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION BY REFERENCE OF MATERIAL SUBMITTED ON A COMPACT DISC

Not Applicable

BACKGROUND TO THE INVENTION

1. Field of the Invention

This invention generally relates to the field of photolithography as employed for the fabrication of micro- and nano-structures, and it relates particularly to the field of Talbot imaging as employed for transferring periodic patterns of features defined in a mask onto a photosensitive layer on a substrate, and more particularly to the printing of patterns that are periodic in one dimension.

2. Description of Related Art

Lithographic fabrication enables the formation of micro- and nano-patterns on surfaces. Photolithographic techniques achieve this by exposing a photosensitive surface to a light-field with an intensity distribution corresponding to the desired pattern. The photosensitive surface is usually a thin layer of sensitive film, such as a photoresist, which is coated either directly onto a substrate or indirectly over intermediate layers of other materials or structured materials. Chemical or physical changes that occur in the photoresist is used in subsequent processes to obtain a desired pattern in the material of the substrate or in a layer of another material on the substrate. In the most commonly used photolithographic technique an image of the pattern, which is initially defined in a mask, is projected onto the substrate surface using an optical system.

Many applications require the formation of high-resolution grating patterns that comprise parallel lines and spaces that repeat with a sub-micron period in one direction. Examples of such applications are grating polarizers, coupling gratings for biomedical sensors, and light trapping gratings for solar cells. A specialized photolithographic technique based on the Talbot effect is advantageous for transferring such patterns from masks onto substrates because it avoids the use of a conventional imaging system which, for high resolution patterns, is generally complex and high-cost. In this technique a mask defining the periodic pattern is illuminated with a collimated beam of monochromatic light and the light diffracted by the pattern reconstructs "self-images" of the pattern at certain distances from the mask in Talbot image planes (see, for example, C. Zanke, et al., "Large area patterning for photonic crystals via coherent diffraction lithography", J. Vac. Sci. Technol. B 22, 3352 (2004)). The separation, S, between successive Talbot image planes is related to the illumination wavelength, $\lambda$, and period of the pattern, p, by $$S \approx 2p^2/\lambda \qquad \text{equ.(1)}$$

Between the self-images in the Talbot planes are so-called Talbot sub-images that have higher spatial frequencies. By placing a photoresist coated substrate at one of these fractional Talbot planes, a periodic pattern is printed whose spatial frequency is higher than that in the original mask. The results achieved with this technique are improved when the duty cycle of the pattern in the mask, that is the ratio of the width of the lines to the width of the spaces, is optimized to yield a high-contrast intensity distribution in the fractional Talbot planes (see U.S. Pat. No. 4,360,586). In the prior art, it is also known that the contrast of the Talbot images can be further enhanced by fabricating the periodic patterns in the mask from phase shifting materials. With the Talbot technique, however, the intensity distributions of the self-images and sub-images are very sensitive to the distance from the mask, that is, they have a very narrow depth of field. This means the substrate has to be very accurately positioned with respect to the mask in order to obtain a correctly printed grating. This becomes increasingly more difficult as the grating period is reduced because the depths of field of the self-images and sub-images are proportional to the square of the pattern period. Furthermore, if the pattern needs to be printed onto a substrate that is not very flat or has topographical features on its surface, or into a thick layer of photoresist, it may be impossible to achieve the desired result.

Achromatic Talbot lithography has recently been introduced as a new method for printing high-resolution periodic patterns in a cost effective way (see N. Guérineau et al., "Talbot experiment re-examined: demonstration of an achromatic and continuous self-imaging regime", Opt. Commun. 180, pp. 199-203 (2000); H. H. Solak, et al., "Achromatic Spatial Frequency Multiplication: A Method for Production of Nanometer-Scale Periodic Structures", J. Vac. Sci. Technol., 23, pp. 2705-2710 (2005); and U.S. Pat. Appl. no. 2008/0186579). It offers two significant advantages for lithographic applications: firstly, it overcomes the depth-of-field problem encountered in the classical Talbot method described above, and secondly, for many pattern types the printed patterns have a higher spatial-frequency than that in the mask, that is, it can perform a spatial-frequency multiplication. Achromatic Talbot lithography (ATL) illuminates the mask with a collimated beam from a broadband source and the substrate to be printed is placed at or beyond a certain distance from the mask at which the image generated becomes stationary, that is, invariant to further increase in distance. The minimum distance, $d_{min}$, required for the stationary image to be formed is related to the period of the pattern, p, in the mask and to the spectral bandwidth of the illumination, $\Delta\lambda$, by:

$$d_{min} \approx 2p^2/\Delta\lambda \qquad \text{equ.(2)}$$

The distance at which a particular desired level of insensitivity of the printed pattern to variation of distance between substrate and mask may be accurately determined by computer simulation. At this distance the Talbot image planes for the different wavelengths are distributed in a continuous manner with increasing distance from the mask, and so placing the substrate beyond this distance effectively exposes the substrate to the entire range of lateral intensity distributions that occur between successive Talbot planes for a particular wavelength. The pattern printed onto the substrate therefore corresponds to the integration, or average, of this range of transversal intensity distributions, and so is insensitive to further increase in distance from the mask. The resulting extended depth of field is also substantially greater than that of images formed using conventional lithographic techniques such as projection, proximity or contact printing.

If ATL is applied to one-dimensional, line/space patterns, the stationary image printed onto the substrate generally exhibits spatial-frequency multiplication: the period of the pattern is reduced by a factor of two. The intensity distribution in the ATL image produced by a particular mask pattern may be determined using modeling software that simulates the propagation of electromagnetic waves through masks, layers of other material and through space. Such simulation tools may therefore be used to optimize the design of the pattern in the mask for obtaining a particular printed pattern at the substrate surface.

The ATL method has been developed primarily to print periodic patterns that comprise a unit cell that repeats with a constant period in at least one direction. The technique may, however, also be successfully applied to patterns whose period spatially varies in a sufficiently "slow", gradual way across the mask such that the diffraction orders that form a particular part of the stationary image are generated by a part of the mask in which the period is substantially constant. The tolerance to such variation in period may be determined using analytical methods or modeling software of the type mentioned above, and the patterns concerned may be characterized as being quasi-periodic.

A drawback of ATL arising from equ. (2) is that it requires a light source with a significant spectral bandwidth in order that the separation required between the mask and substrate is not disadvantageously large. The angular divergence of the different diffracted orders propagating from the mask produces spatial offsets between the orders at the substrate surface and therefore imperfect image reconstruction at the pattern edges, which becomes worse with increasing separation. Fresnel diffraction at the edges of the diffracted orders also degrades the edges of the printed pattern, which likewise gets worse with increasing separation. For these reasons laser sources, which have relatively small spectral bandwidth, are in most cases unsuitable for ATL.

A difficulty with applying non-laser sources, such as arc lamps or LEDs, to ATL is obtaining the combination of high power in the exposure beam (for ensuring high throughput in a production process) and also good beam collimation (for ensuring high-contrast Talbot imaging). Obtaining good collimation from these sources requires spatial filtering of the output beam which generally results in a large loss of power.

The advantages offered by the ATL technique may also be obtained using another prior art modification of the classical Talbot method. In this alternative scheme, the periodic pattern in the mask is illuminated by a well collimated beam of light and during exposure the substrate is displaced longitudinally relative to the mask by at least a distance corresponding substantially to the separation between successive Talbot image planes. The technique, which may be called Displacement Talbot lithography (DTL), also results in the substrate being exposed to the entire range of lateral intensity distributions between Talbot image planes, thereby also producing an integration, or averaging, of the entire range of transversal intensity distributions between Talbot planes over the duration of the exposure (see also U.S. patent application Ser. No. 11/665,323).

Whereas the integrated intensity distributions generated at the substrate by the ATL and DTL techniques are substantially the same, and both enable a large depth of field for the printed pattern and spatial-frequency multiplication, the DTL scheme has the advantage that it can be used with much smaller separations of the substrate and mask. This improves the edges of the printed pattern and allows higher utilization efficiency of the light source because of the less stringent requirement on collimation. Further, the DTL technique facilitates the use of laser sources, which generally provide substantially monochromatic light and are often preferred for production processes. Light from laser sources can be collimated well without loss of power, which enables a larger separation between the mask and substrate and also printing onto substrates that have significant warp or topography.

The structure of the patterns printed using DTL from a particular mask pattern can also be theoretically determined using simulation software. As for ATL, DTL is also not restricted to purely periodic patterns but may be applied to quasi-periodic patterns.

A drawback of the DTL technique is that the exposure equipment needs to provide a controlled displacement of the substrate with respect to the mask during the exposure, which can increase system complexity and cost, and can reduce reliability. This is especially true if the substrate is very large or if the substrate is exposed using a scanning strategy in which a beam of relatively small dimension is scanned across the substrate at high speed in order to achieve a short exposure time.

The as yet unpublished U.S. application Ser. No. 12/706,081 by the applicant describes refinements of the ATL and DTL techniques that employ a source with significant spectral bandwidth and a displacement of the substrate with respect to the mask respectively in order to print general periodic structures onto substrates with a large depth of focus. Because these refinements incorporate the principles of the ATL and DTL techniques for increasing the depth of focus of the printed patterns, they necessarily have the same drawbacks of those techniques.

It is therefore an object of the present invention to provide a method for printing onto a substrate a pattern of features that is periodic in one-dimension which provides a large depth of focus and does not require a relative displacement between a mask and substrate during the exposure.

It is a further object of the present invention to provide a method for printing a pattern of features that is periodic in one-dimension onto a substrate that enables the use of a laser source.

It is a specific object to provide a method for printing a high-resolution grating pattern onto large substrates in a short printing time.

It is a further object of the present invention to provide an apparatus for printing a pattern of features that is periodic in one-dimension such that the large depth of focus of the ATL and DTL techniques is obtained but without the above-mentioned associated disadvantages of these two techniques.

It is a further object of the invention for providing a method and apparatus for fabricating polarizer gratings, grating couplers for, for example, bio-sensors, and light couplers for solar cells.

SUMMARY OF THE INVENTION

According to a first aspect of the present invention, a photolithographic method related to Talbot imaging is provided for printing a desired periodic pattern of linear features into a photosensitive layer of a substrate, which method includes:
a) providing a mask bearing a mask pattern of linear features that are parallel to a first direction with a period that is twice that of the desired pattern;
b) arranging the photosensitive layer substantially parallel to the mask and with a separation from the mask pattern;

c) generating substantially monochromatic light at a wavelength; and
d) illuminating the mask pattern with said light over a range of angles of incidence in a plane parallel to said first direction, at substantially a single angle in an orthogonal plane of incidence, and so that the light of each angle of incidence transmitted by the mask forms a light-field component at the photosensitive layer, whereby the integration of said components prints the desired pattern;

wherein the range of angles is selected in relation to the wavelength, the separation and the period so that the integration of said components corresponds substantially to an average of the range of transversal intensity distributions formed between Talbot image planes by light at one of the angles of incidence.

By selecting the angular range so that the substrate is exposed to substantially the average of the range of transversal intensity distributions that are formed between Talbot image planes by illuminating the mask pattern with a single angle of incidence, an equivalent exposure to that produced by the ATL or DTL techniques is achieved. For patterns that are periodic in one direction, the present invention therefore offers the same major advantage as the ATL and DTL techniques by enabling high-resolution patterns to be printed with a large depth of field. Since a laser may be employed as the illumination source it overcomes the main drawback of ATL, and since it does not require relative displacement of the substrate with respect to the mask during the exposure it overcomes the main drawback of DTL.

The light of the different angles of incidence over the range may illuminate a feature in the mask either simultaneously or sequentially.

Preferably, the light of the different of angles of incidence has an intensity distribution over the range that varies smoothly, and advantageously is a Gaussian distribution.

The light may gave other intensity distributions over the range of angles that have sharper, or more abrupt, variation, such as a rectangular distribution, or be a discontinuous distribution such as composed of a set of discrete angles.

Preferably the range of angles has a mean angle that is in the range 10° and 60°. Advantageously, the angular bandwidth of the range of angles, that is, the difference between the maximum and minimum angles, is small in relation to the mean angle.

Preferably, the range of angles is selected using at least one of an analytical formula, a computer simulation of the light-field components transmitted by the mask pattern illuminated by light over a range of angles of incidence, and experimental optimization.

According to a second aspect of the present invention, a photolithographic apparatus related to Talbot imaging is provided for printing a desired periodic pattern of linear features into a photosensitive layer of a substrate, which apparatus includes:
a) a mask bearing a mask pattern of linear features that are parallel to a first direction with a period that is twice that of the desired pattern;
b) a means for arranging the photosensitive layer substantially parallel to the mask and with a separation from the mask pattern;
c) a means for generating substantially monochromatic light at a wavelength;
d) a means for illuminating the mask pattern with said light over a range of angles of incidence in a plane parallel to said first direction, at substantially a single angle in an orthogonal plane of incidence, and so that the light of each angle of incidence transmitted by the mask forms a light-field component at the photosensitive layer, whereby the integration of said components prints the desired pattern;

wherein the range of angles is selected in relation to the wavelength, the separation and the period so that the integration of said components corresponds substantially to an average of the range of transversal intensity distributions formed between Talbot image planes by light at one of the angles of incidence.

The linear features in the mask preferably comprise lines of an opaque material or lines of a phase shifting material.

Preferably there is an single linear feature per period of the mask pattern, though a plurality of linear features in one or more materials per period of the pattern may also be employed.

Preferably, the illuminating means forms a beam of light whose angle of incidence at the mask varies across the beam, and provides a scanning motion of the beam relative to the mask during the printing of the desired pattern. The scanning motion may either be a two-dimensional pattern, such as a raster pattern, or a one-dimensional scan. The displacement in the scanning motion is preferably performed by the beam itself, but may alternatively be performed by the mask and substrate sub-system or, in the case of a two-dimensional scan pattern, be performed partly by the beam and partly by the mask and substrate sub-system.

Alternatively, the illuminating means forms a beam of light at the mask pattern whose angle of incidence is substantially constant across the beam, and arranges that the angle of incidence of the beam at the mask pattern is changed over the range of angles during the printing of the desired pattern.

Advantageously, the illuminating means forms a beam at the mask pattern whose light has the range of angles of incidence at each point of the beam, and preferably the beam is substantially stationary during the printing of the desired pattern.

Alternatively, the illuminating means forms a beam whose light at the mask pattern has the range of angles of incidence at each point of the beam, and arranges that the beam is scanned relative to the mask during the printing of the desired pattern. The actual displacement in the scanning motion may be performed by the beam or by the mask and substrate, or by a combination of the two.

Also advantageously, an immersion fluid may be included between the mask pattern and photosensitive layer in order to print patterns of smaller period using a given illumination wavelength.

Further, the period of the desired pattern of linear features and the period of the mask pattern of linear features are not necessarily exactly constant across the respective patterns, but may be substantially periodic, that is, quasi-periodic.

The photosensitive layer of the substrate may be a layer within the material of the substrate itself that has been treated to render it photosensitive or, preferably, is a layer of another, material that has been deposited onto the substrate, either directly on the substrate's surface or indirectly with uniform or structured intermediate layers of one or more materials between the photosensitive layer and the substrate. Advantageously, the photosensitive layer is a layer of photoresist.

BRIEF DESCRIPTION OF THE SEVERAL VIEWS OF THE DRAWINGS

The above and/or other aspects of the present invention will become apparent and more readily appreciated from some exemplary embodiments described below, taken in conjunction with the accompanying drawings, in which.

DETAILED DESCRIPTION OF THE INVENTION

Figure 1:
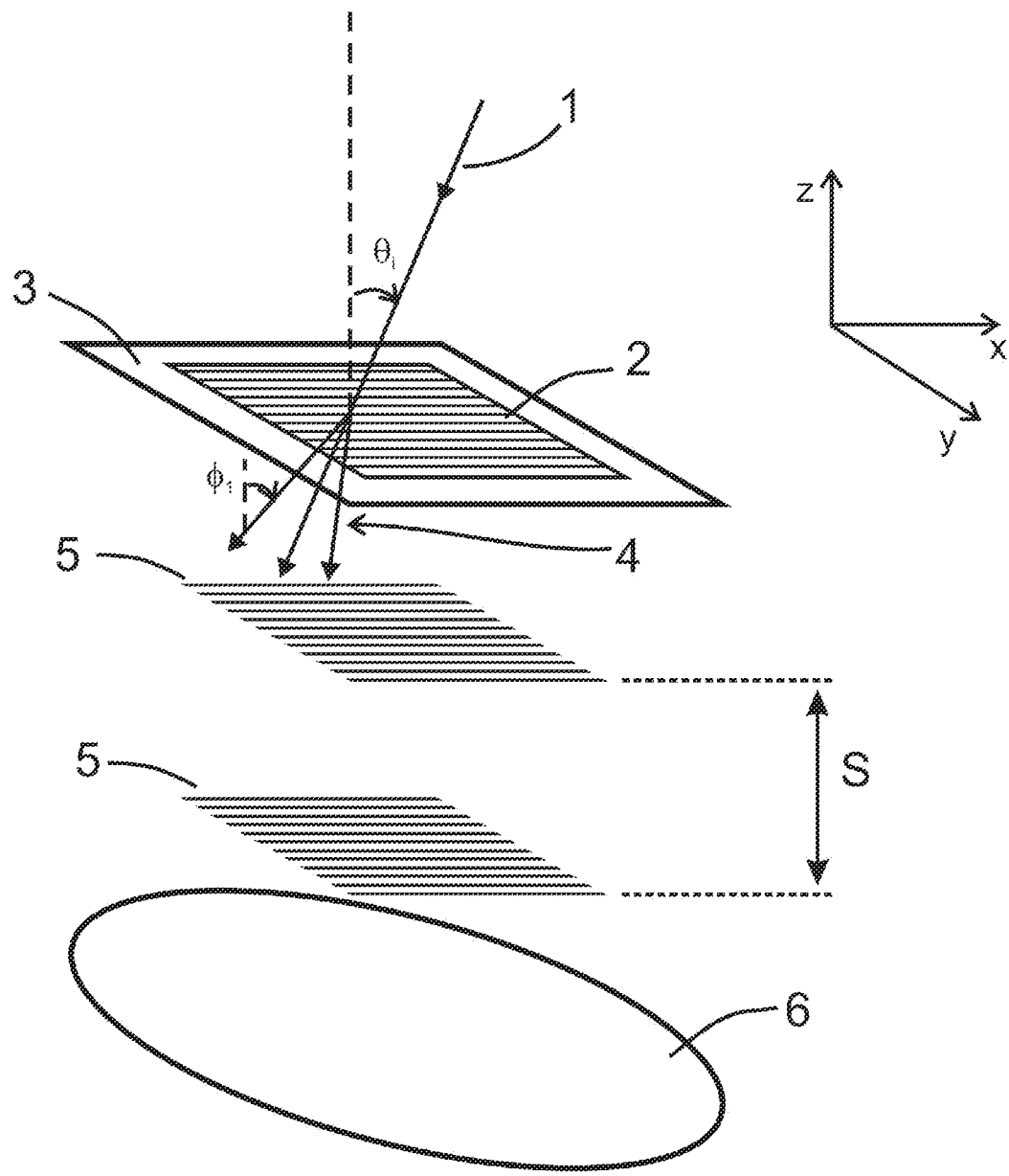
FIG. 1 illustrates the generation of Talbot images by illuminating a mask with a beam at an oblique angle of incidence.

With reference to FIG. 1, which is used to explain the general concept of the present invention, a collimated beam of monochromatic light 1 with wavelength, $\lambda$, is incident (from air) onto a mask 3 bearing a grating pattern 2 consisting of opaque parallel lines and transparent spaces with a period, p. The mask 3 lies parallel to the xy plane (with reference to the axes marked in the figure) and the lines of the grating pattern 2 are parallel to the x-axis. The beam 1 illuminates the mask 3 at an oblique angle of incidence whose components in the yz and xz planes are respectively ~0° and $\theta_i$. The interaction of the beam 1 with the periodic structure of the grating pattern 2 generates a set of transmitted diffraction orders 4 (only $0^{th}$ and $1^{st}$ orders are shown in the figure, though higher orders may also be present) that diverge away from the mask 3. From fundamental principles of diffraction theory, it may be stated that the polar angle of the mth diffracted order, $\phi_m$, (i.e. the angle the mth diffracted order makes with the normal to the mask, 3) is given by $$\sin^2 \phi_m = \sin^2 \theta_i + (m\lambda/p)^2, \quad m=0, \pm 1, \pm 2 \qquad \text{equ. (3)}$$

The interference between the propagating diffracted orders 4 produces transversal intensity distributions in planes parallel to the mask 3 that vary in an oscillating manner with increasing distance from the mask such that at certain, periodic intervals, a self-image 5, or Talbot image, is produced of the grating 2 in the mask 3. In order that Talbot images are formed it is necessary that at least the $1^{st}$ diffraction orders propagate after the grating, so it is important that the period of the grating and angle of incidence of the beam are selected in relation to the wavelength so that the polar angle of the $1^{st}$ diffracted order calculated using equ. (3), $\phi_1 < 90°$. According to classical Talbot imaging, the relative phases of the $0^{th}$ and $1^{st}$ diffracted orders change by $2\pi$ between successive Talbot image planes 5. Since the $0^{th}$ order propagates in the direction of the incident beam, the separation, S, of successive image planes 5 may therefore be represented by $$S=\lambda/(\cos\theta_i - \cos\phi_1) \qquad \text{equ. (4)}$$

Figure 2A:
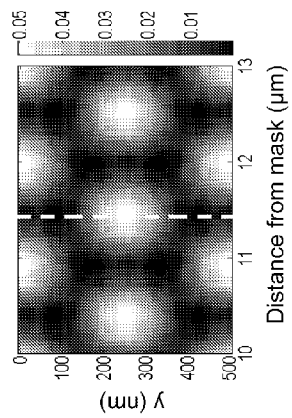
FIG. 2 illustrates the displacement of Talbot image planes produced by changing the angle of incidence of an illumination beam.
Figure 2B:
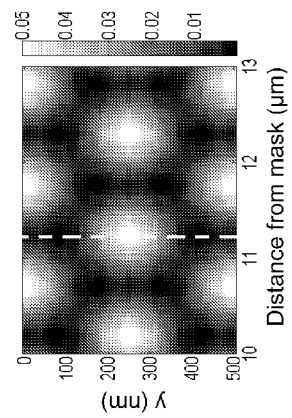
Figure 2C:
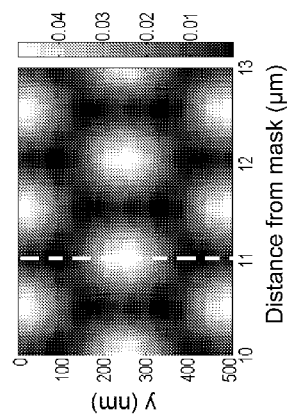

It can be concluded that the separation of the Talbot planes 5 depends on the angle of incidence of the illumination beam 1, $\theta_i$, and that changing the angle of the beam in the xz plane displaces the Talbot image planes 5 either towards or away from a substrate 6 located below the mask 3. This is illustrated in the computer simulated results of FIGS. 2a, 2b and 2c which show the dependence of the transmitted light-field on the angle of incidence, in a region between 10 and 13 μm from an illuminated grating with a period 500 nm and over a range of y values corresponding to one period of the grating. FIGS. 2a, 2b and 2c show respectively the intensity distributions produced with angles of incidence of 22.5°, 24° and 25.5°. The annotated dashed white lines in the figures indicate the locations of the Talbot image planes, from which their displacement with changing angle is evident.

It should be mentioned that, for reasons of symmetry, the self-images do not displace in the y direction as the angle is changed. They do, however displace slightly in the x direction but this may be neglected (except at the pattern edges) because the lines of the grating pattern 2 in the mask 3 are uniform and continuous in the x direction.

Figure 3:
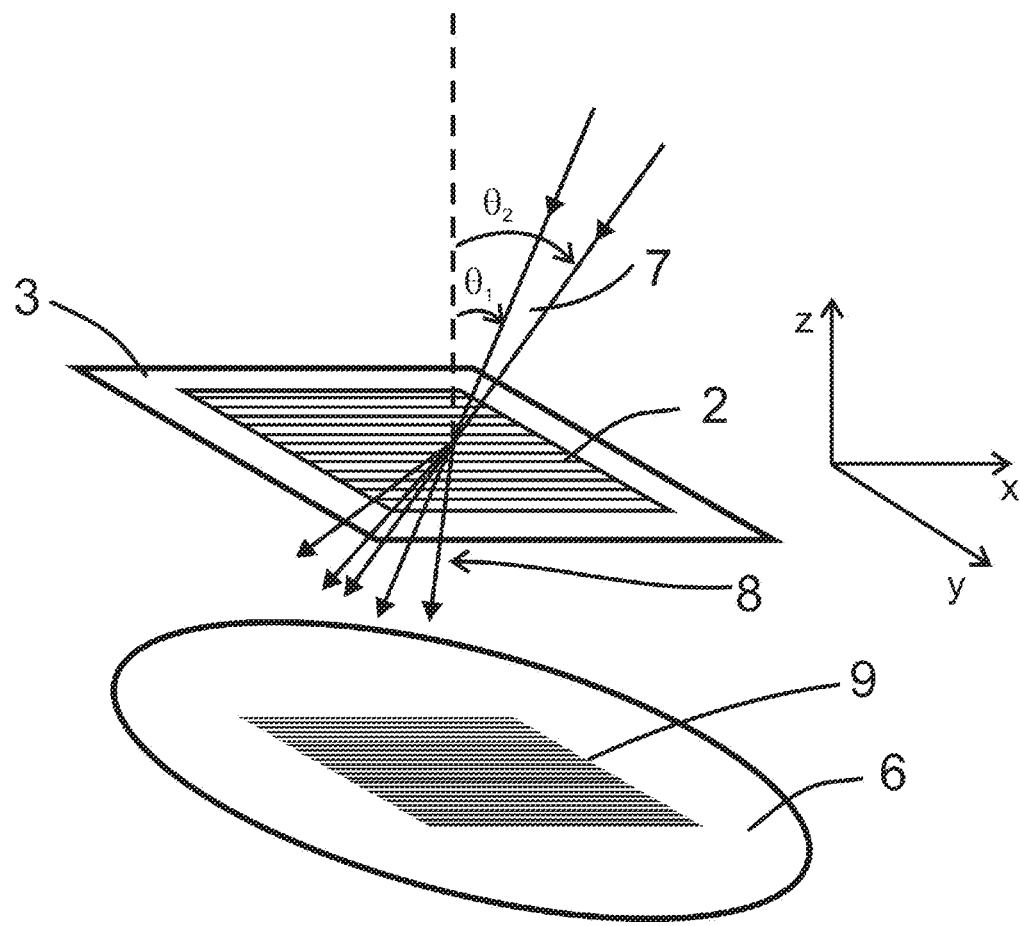
FIG. 3 illustrates the generation of a stationary image on a substrate using a range of angles of illumination.

With reference to FIG. 3, by illuminating instead each point of the grating 2 in mask 3 with a range of angles of incidence in the xz plane whose angular limits, $\theta_1$ and $\theta_2$, are selected in relation to the distance, d, of the substrate 6 from the mask 3, the period of the grating 2 and the wavelength of the beam 7 (and at ~0° angle of incidence in the yz plane) such that the substrate 6 is exposed to the entire range of transversal intensity distributions between successive Talbot planes, then the exposure produced at the substrate 6 by the diffracting light-field 8 is equivalent to that produced by the ATL and DTL techniques, and a "stationary image" (i.e. one with an extended depth of field) that has half the period of the grating 2 in the mask 3 is printed onto the substrate 6.

Conversely, if the grating 2 is illuminated by a beam 7 with a range of angles of incidence between limits, $\theta_1$ and $\theta_2$, and $S_1$ and $S_2$ are the respective separations of the Talbot planes for these angular limits, then the substrate 6 is exposed to an average of the entire range of transversal intensity distributions between Talbot planes if it is located at a minimum distance, $d_{min}$, from the mask 3 given by $$d_{min}=S_1 S_2/(S_1+S_2) \qquad \text{equ. (5)}$$

In the case that the angular bandwidth, or convergence/divergence angle, $\Delta\theta_i$, required of the illumination beam 7 for producing a stationary image is small in relation to its mean angle of incidence, it is further derived using equs. (3), (4) and (5) that $$\Delta\theta_i \geq S \cos\phi_1/(d \sin\theta_i) \qquad \text{equ. (6)}$$

where d is the distance of the substrate 6 from the mask 3 and S is the separation of successive Talbot planes for the mean angle of incidence.

Although equ. (6) only contains a polar angle for the $1^{st}$ diffracted order in the transmitted light-field, it may also be employed for estimating the angular range required when higher orders are present.

As indicated by the equation, the angular bandwidth, $\Delta\theta_i$, required for producing a stationary image at the substrate 6 located at a particular distance from a mask 3, with a particular period of grating 2 in the mask 3, and with a particular wavelength of the illumination beam 7 is not restricted to a particular value but rather refers to a minimum value: it should be sufficient so that the magnitude of the longitudinal displacement of the transversal intensity distributions at the substrate 6 produced by changing the angle over the range is at least the separation of successive Talbot planes.

Furthermore, the distribution of the beam's intensity across the range of angles of incidence does need to be uniform but may have a variety of different forms, for example, a Gaussian distribution or a set of discrete angles with, for example, a rectangular or Gaussian envelope. Many other forms of angular distribution may be contemplated and employed.

Whereas the analytical formula disclosed in equ. (6) enables a good estimation of the angular bandwidth required for a particular grating period, illumination wavelength and mean angle of incidence, it is recommended that computer simulations of the light-field exposing the substrate 6 be additionally or alternatively performed, especially in the case that the intensity distribution over the range of angles has a Gaussian or other non-trivial form. Simulations enable the angular range, the design of the grating (in particular, the period, duty ratio, thickness of chrome or thickness of phase shifting layer) and beam polarization to be optimized with respect to the illumination wavelength and requirements of the particular lithographic process so that the light-field exposing the photoresist has the intensity and contrast required from printing the desired pattern. Whereas it is necessary that $\phi_1<90°$ in order for that the $1^{st}$ diffraction orders can propagate from the illuminated grating, this does not ensure that the resulting light-field exposing the substrate has sufficient contrast for printing the desired pattern: it is preferable that the $1^{st}$ orders propagate at a smaller polar angle, for example, $\phi_1<70°$, which can also be accurately determined by computer simulation for the particular application and photoresist process. Computer simulations may be performed using commercially available programs such as GSolver (produced by Grating Solver Development Co.), or freeware such as MEEP (produced by MIT). These two particular programs are based on different theoretical methodologies for calculating beam propagation through periodic structures: rigorous coupled wave analysis (RCWA) and finite difference time domain (FDTD) respectively. Using such a program the electric field distribution transmitted by a particular structure of grating 2 in the mask 3 can be calculated for a particular wavelength and angle of incidence of the illuminating beam 7, and this calculation repeated over the range of angles of incidence. The light-fields generated at the substrate 6 can then be determined for the each angular component of the illuminating beam 7, and hence integrated to determine the integration of the light-fields at the substrate 6 produced by illuminating with the range of angles of incidence. This integration should take into account any variation of the relative intensity of illumination over the range of angles. The mathematical and computational details of this or similar strategy could be readily understood and implemented by a person skilled in the field. Other computational strategies with greater or lesser degrees of sophistication or precision might alternatively be employed for simulating the integrated intensity distribution exposing the substrate 6 according to any of the teachings or embodiments of the present invention. Following optimization and verification by computer simulation, experimental optimization may be conducted using, for example, any of the embodiments described below.

In the case that the intensity distribution of the beam 7 across its range of angles is uniform, it is most preferable that the angular range is selected so that the magnitude of the longitudinal displacement of the transversal intensity distributions at the substrate 6 produced by changing the angle of incidence over this range closely equates to the separation of successive Talbot planes, that is $$\Delta\theta_i \approx S\cos\phi_1/(d\sin\theta_i) \qquad \text{equ. (7)}$$

With this range the insensitivity of the resulting image to inaccurate adjustment of the separation of the substrate 6 with respect to the mask 3 is maximized: although the pattern 9 printed on the substrate 6 is substantially stationary (i.e. has large depth of field), a varying separation causes some perturbations in the linewidths of the printed grating 9. Angular ranges that correspond to displacements of the transversal intensity distribution that are multiples of the separation of successive Talbot planes yield results that are even more insensitive to inaccurate adjustment of the separation though their practical implementation may be less convenient on account of the larger angular ranges or larger separation. Intermediate angular ranges may also be employed but the printed pattern 9 is less stationary and its linewidths are more sensitive to variation of the separation of the substrate 6 and mask 3. The impact of the selection of the angular range will become more clear in the description relating to FIGS. 4 and 5.

Figure 4:
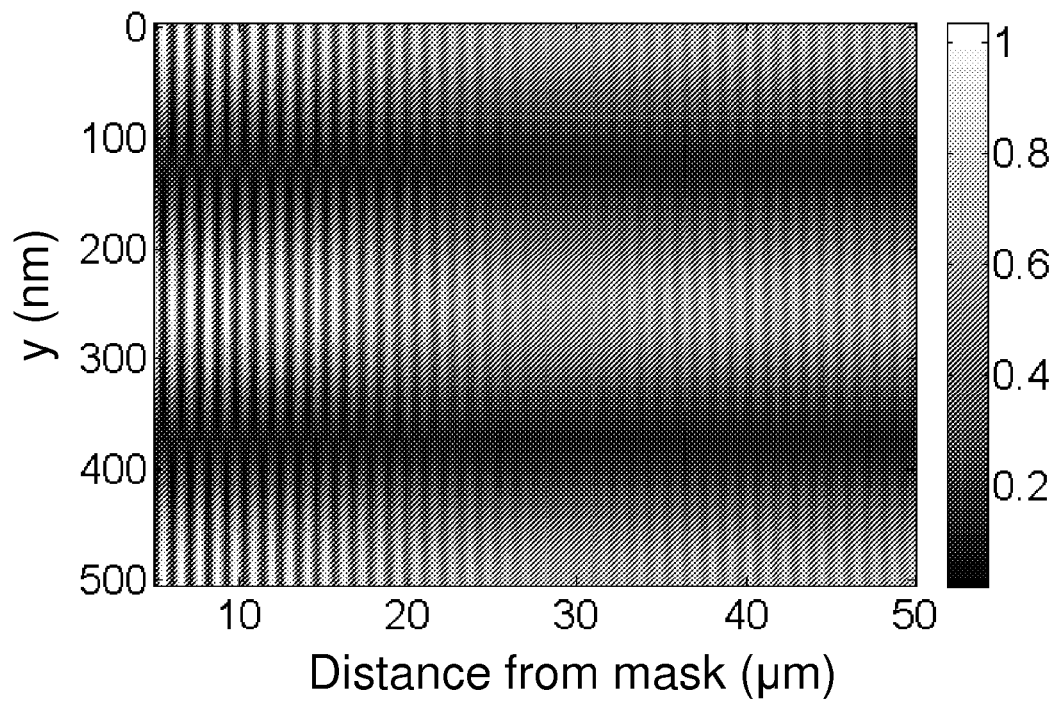
FIG. 4 is a computer simulation of a section of a transmitted light-field generated by illuminating a grating with a beam having a uniform intensity distribution over a range of angles of incidence.
Figure 5:
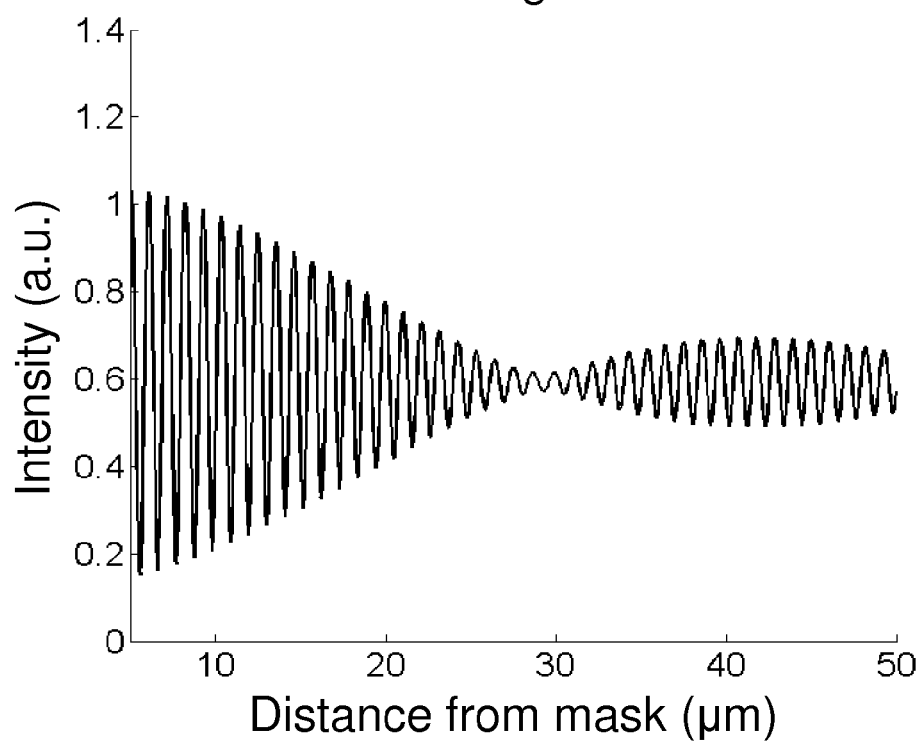
FIG. 5 shows the variation of intensity with increasing distance from the mask along the center of the light-field shown in FIG. 4.

The properties of stationary images formed by illuminating a grating 2 with a beam 7 whose intensity is distributed uniformly over a range of angles of incidence between $\theta_1$ and $\theta_2$ is illustrated in FIG. 4. It shows a computer simulation of the light-field transmitted by a grating pattern with period 500 nm comprising opaque lines of width 400 nm formed in a 80 nm thick layer of chrome and transparent spaces of width 100 nm on a fused silica substrate. The grating pattern is illuminated by a beam of wavelength 355 nm whose light is distributed uniformly over a range of angles of incidence between $\theta_1=21°$ and $\theta_2=24°$ (where $\theta_1$ and $\theta_2$ are defined as in FIG. 3) and has P polarization in the plane of incidence. The section of the light-field shown has a width corresponding to one period of the grating pattern 2 and a length, in the direction of propagation of the light-field, of 50 μm. In the region close to the mask the Talbot image planes and intermediate, inverted planes are well defined, but with increasing distance from the mask the longitudinal dispersion of the Talbot planes caused by the range of angles of incidence reduces the modulation in the direction of beam propagation, and at a distance of ~30 μm the modulation reaches a minimum. At this distance the magnitude of the longitudinal displacement of the transverse intensity distributions produced by changing the angle of incidence across the angular range corresponds to the separation of successive Talbot planes, and is in agreement with interdependence of the various parameter values defined by equ. (7). The dependence of the intensity on increasing distance from the mask at the center of the section of the light-field shown in FIG. 4 (i.e. at y=250 nm) is represented in FIG. 5, from which the gradual reduction in the contrast of the intensity oscillation with increasing distance until it reaches a minimum at ~30 μm is also apparent.

Figure 6:
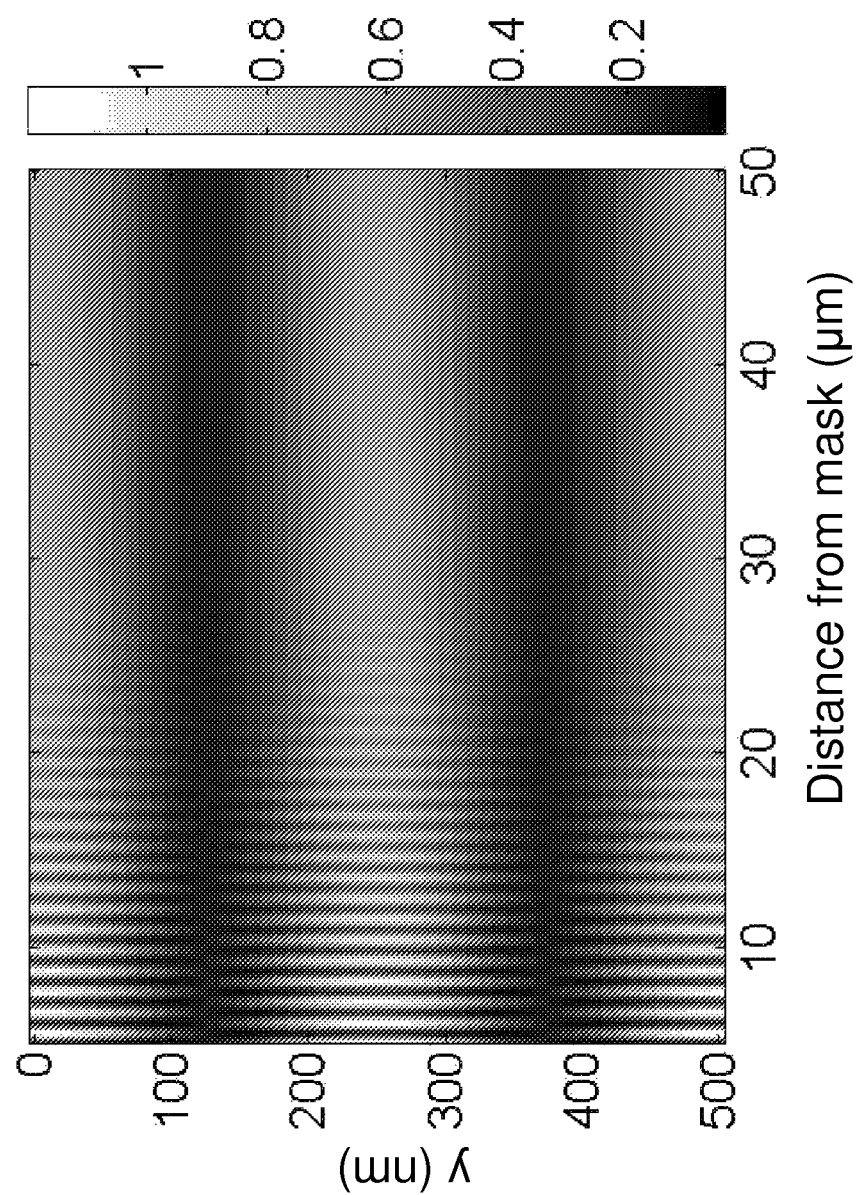
FIG. 6 is a computer simulation of a section of a transmitted light-field generated by illuminating a grating with a beam having a Gaussian intensity distribution over a range of angles of incidence.

FIG. 6 shows the result of a computer simulation of the intensity distribution transmitted by a mask in the case that the intensity distribution across the range of angles has a Gaussian profile. The pattern in the mask is a grating of period of 500 nm that comprises alternating opaque lines of width 400 nm, formed in a 80 nm thick layer of chrome, and transparent spaces of width 100 nm, on a fused silica substrate. The grating is illuminated by a beam of light with wavelength 355 nm whose mean angle of incidence is 22.5° and whose angular distribution in the plane parallel to the grating lines is Gaussian with a σ value of 1.5°. The beam is P polarized in the plane of incidence. The section of the light-field shown in FIG. 6 has a width corresponding to one period of the grating pattern and a length, in the direction of propagation of the light-field, of 50 µm. In the region close to the mask the Talbot image planes and intermediate, inverted planes are well defined, but with increasing distance from the mask the longitudinal dispersion of the planes produced by the range of angles of incidence reduces the modulation in the propagation direction such that beyond a distance of ~30 µm from the mask, the modulation of the intensity distribution in the direction of propagation disappears and a truly stationary image is obtained.

Figure 7:
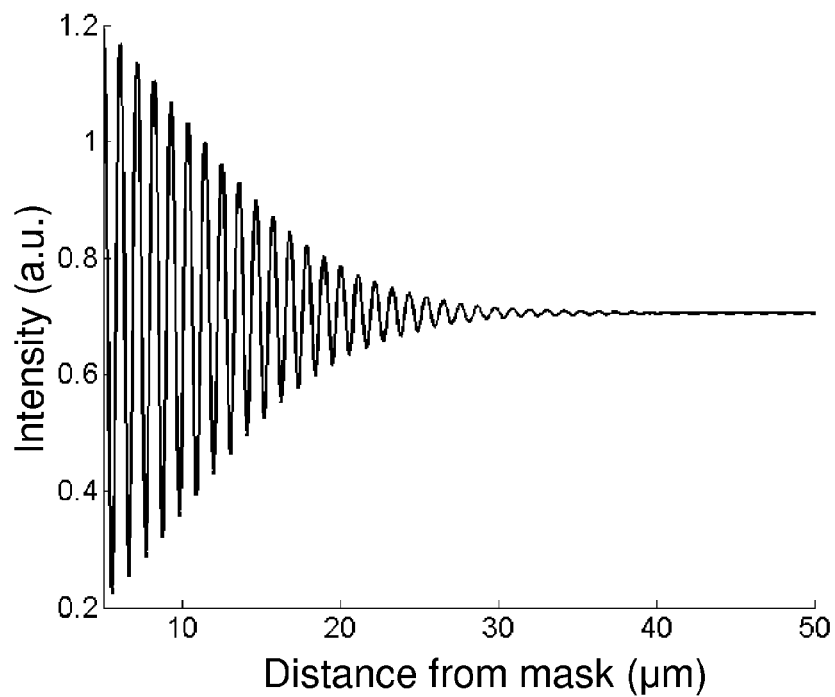
FIG. 7 shows the variation of intensity with increasing distance from the mask along the center of the light-field shown in FIG. 6.

The dependence of the intensity on increasing distance from the mask at the center of the section of the light-field shown in FIG. 6 (i.e. at y=250 nm) is represented in FIG. 7. The gradual reduction in the contrast of the intensity oscillation with increasing distance from the mask can be clearly seen, also showing that the intensity reaches a constant, stable value at distances greater than ~40 µm from the mask.

If the intensity distribution over the range of angles of the illumination beam has a Gaussian profile, then equ. (7) may still be employed for estimating the angular bandwidth required of the beam for a given mean angle of illumination, but it is recommended that the result should rather refer to the σ value of the Gaussian distribution. For a more accurate optimization and verification computer simulations should be performed.

Figure 8:
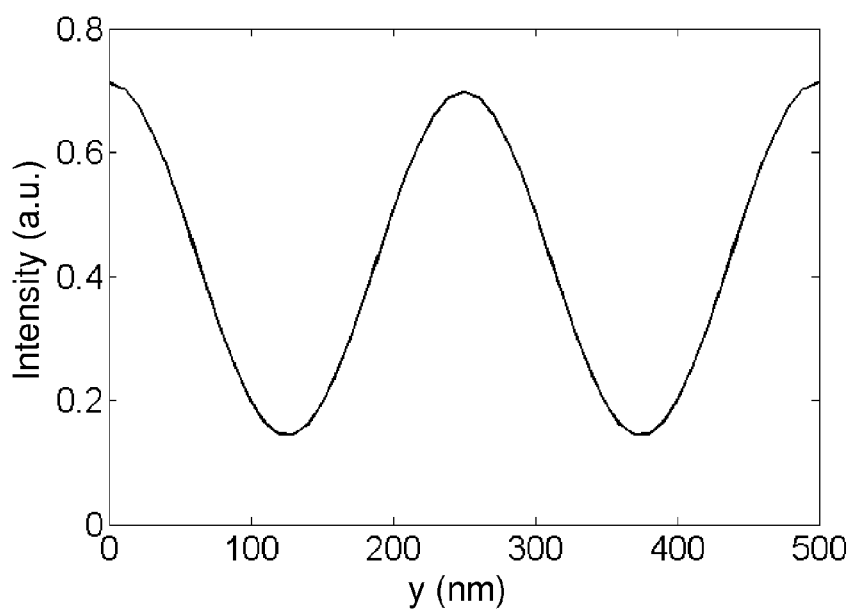
FIG. 8 shows the intensity distribution across the light-field shown in FIG. 6 at a distance where a stationary image is formed.

FIG. 8 shows the intensity distribution across the propagating light-field in FIG. 6 at a distance of 50 µm from the mask, that is, in the region where the longitudinal dependence has disappeared and a stationary image is formed. As can be seen, the period of the oscillation is half that of the grating in the mask, demonstrating that frequency multiplication has been achieved, and the contrast of the intensity oscillation in the image is ~65%, demonstrating that its suitability for an effective lithographic process.

From the results shown in FIGS. 4 to 7, the advantage of employing a beam whose intensity distribution over the range of angles is Gaussian rather than rectangular is evident. In fact, more generally, intensity distributions that vary in a smooth, gradual manner over the angular range rather than have a sharp transition, as is the case for a rectangular distribution, are preferred in order to enhance the depth of focus of the printed pattern.

Figure 9A:
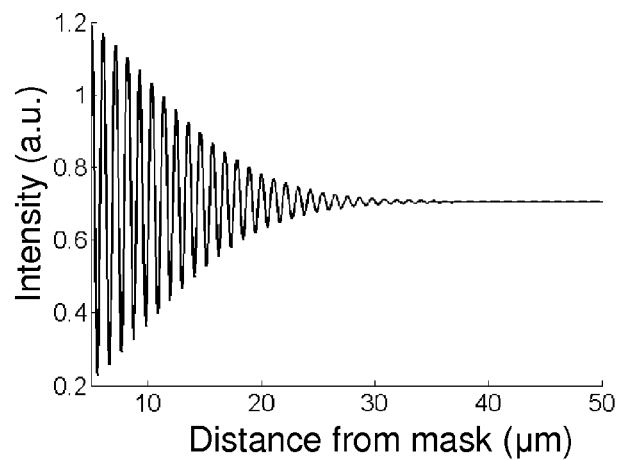
FIGS. 9a, 9b and 9c illustrate the dependence of the stationary image on the angular bandwidth of the illumination, in the case of a Gaussian intensity distribution over the angular range.
Figure 9B:
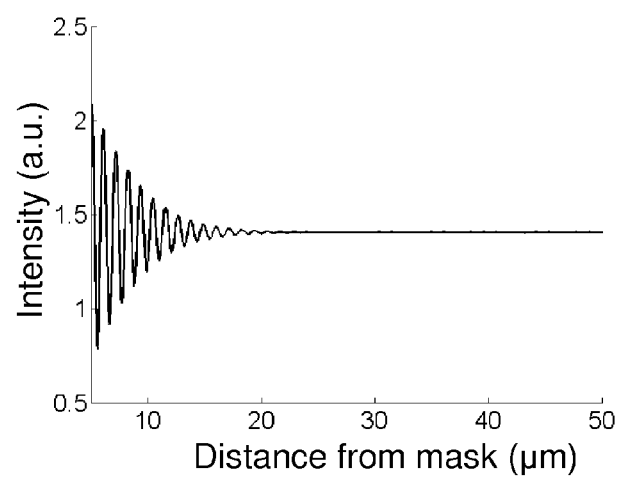
Figure 9C:
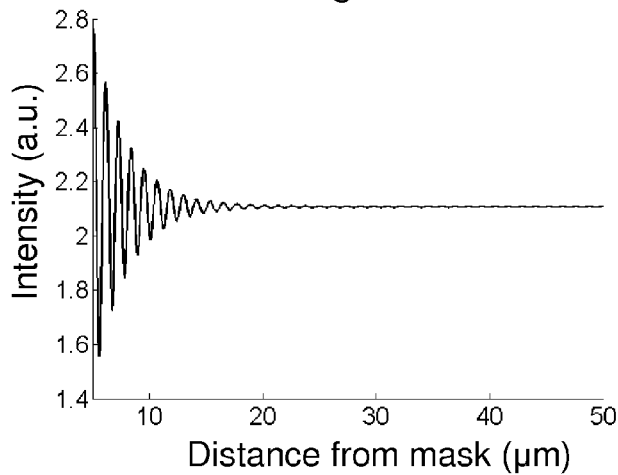

The effect of changing the angular bandwidth of the illumination beam, $\Delta\theta_i$, on the intensity oscillation after the mask in the direction of beam propagation whilst keeping the mean angle of incidence, $\theta_i$, the same is illustrated in FIGS. 9a, 9b and 9c. Each show the variation of the intensity with increasing distance at the same y-coordinate of the propagating light-field in the case of a grating of period 0.5 µm illuminated by a beam of wavelength 355 nm with a mean angle of incidence of 22.5°, but for different values of angular bandwidth: in FIG. 9a the σ value of the Gaussian angular distribution is 1.5°, in FIG. 9b it is 3°, and in FIG. 9c it is 4.5°. From these it is evident that increasing the angular bandwidth of the illumination beam with the same mean angle of incidence reduces the distance at which the stationary image is formed.

Figure 10A:
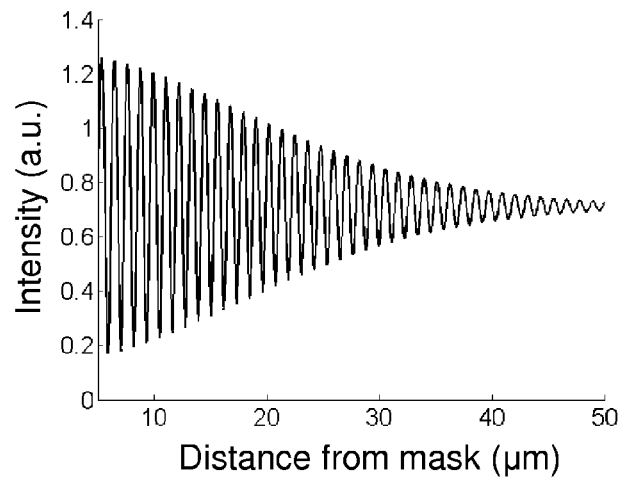
FIGS. 10a, 10b and 10c illustrate the dependence of the stationary image on the mean angle of illumination in the case of a Gaussian intensity distribution over the angular range.
Figure 10B:
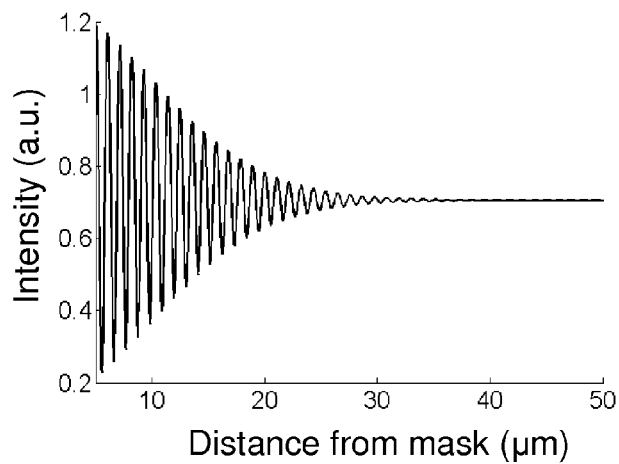
Figure 10C:
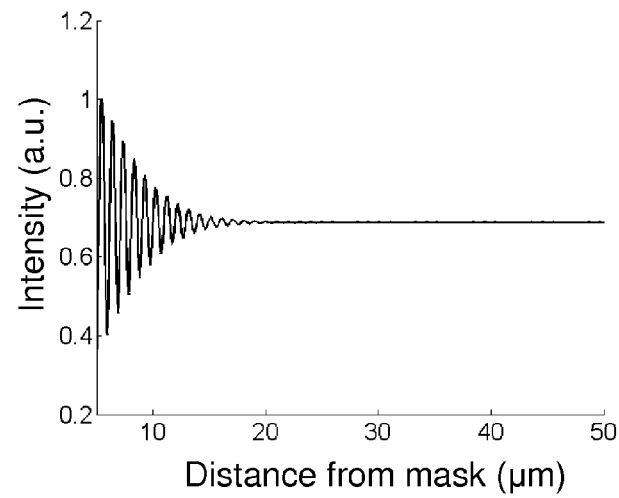

The effect of changing the mean angle of incidence of the illuminating beam, $\theta_i$, on the intensity oscillation after the mask in the direction of beam propagation whilst keeping the angular bandwidth of the beam, $\Delta\theta_i$, the same is illustrated in FIGS. 10a, 10b and 10c. Each show the variation of the intensity with increasing distance at the same y-coordinate of the propagating light-field in the case of a grating of period 0.5 µm illuminated by a beam of wavelength 355 nm with an angular convergence 1.5°, but for different values of mean angle of incidence: in FIG. 10a, the mean angle is ~15°, in FIG. 10b it is ~22.5°, and in FIG. 10c it is ~30°. From these it is evident that increasing the angle of incidence of a beam without changing its angular bandwidth also reduces the distance at which the stationary image is formed.

The dependencies illustrated in the simulation results of FIGS. 9a, 9b and 9c and 10a, 10b and 10c may also be deduced from equ. (7).

Whereas, the range of angles of incidence of the illumination beam in a plane parallel to the lines of the grating should be sufficient in order to expose the substrate to the desired stationary image, the angular bandwidth of the incident beam in the orthogonal plane of incidence should be restricted to a very small value (i.e. substantially a single angle). It is not necessary, however, that the angle of the beam in this plane be normal to the mask, although this is selected in the description and employed in the embodiments for reasons of practical convenience and clarity of description. In fact, in the yz plane the illumination beam may be inclined by several degrees or more without disadvantage to the printed pattern. A change of angle in the orthogonal plane, however, displaces the stationary image at the substrate in a direction orthogonal to the lines of the stationary image, so exposing with a range of angles in this plane degrades the image contrast. Specifically, if the angle of the beam changes by $\Delta\phi$ in the plane of incidence orthogonal to the grating lines and the substrate is at distance d from the mask, the stationary image is displaced by a distance, $\Delta x$, given by $$\Delta x = d\Delta\phi, \qquad \text{equ. (8)}$$

Given that $\Delta x$ should typically be less than one quarter of the linewidth of the printed pattern, L, in order to avoid unacceptable loss of image contrast, it can be estimated that the permitted range of angles in the orthogonal plane for a particular distance, d, of the substrate from the mask is:

$$\Delta\phi \leq \pm L/(8d), \qquad \text{equ. (9)}$$

Depending on the particular application, this condition may be tightened or relaxed.

Figure 11:
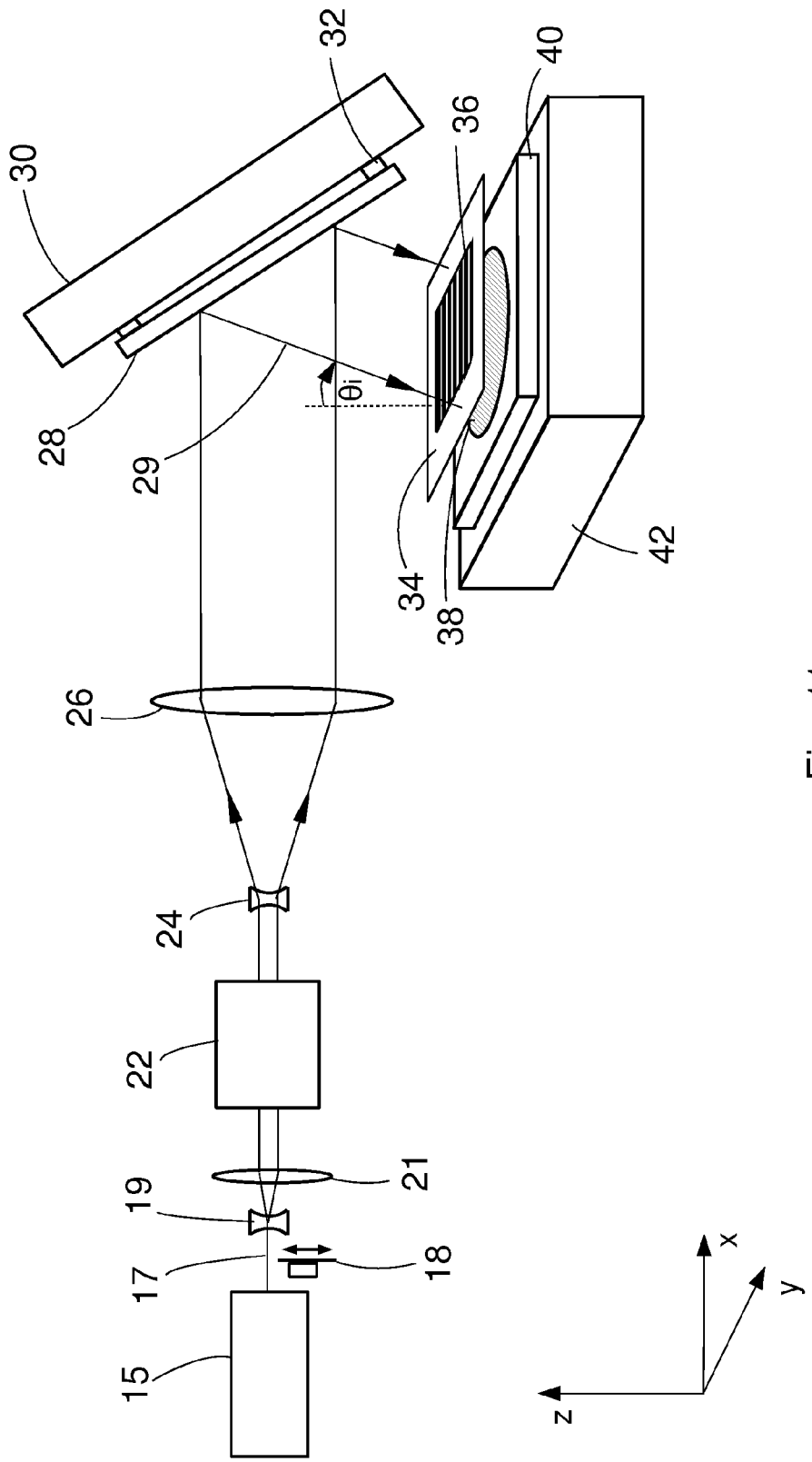
FIG. 11 illustrates a first embodiment of the present invention in which a grating is exposed to a range of angles of illumination by an angular scan of a beam whose light is substantially collimated.

With reference now to FIG. 11 which schematically shows a first exemplary embodiment of the invention, a frequency-tripled, pulsed diode-pumped solid-state (DPSS) laser 15 produces a collimated beam 17 of wavelength 355 nm, output power ~0.5 W and diameter ~1 mm. The beam 17 is also in single transverse mode (i.e. has a Gaussian intensity profile) and is polarized in the xz plane (see axes indicated in the figure). The pulse rate of the DPSS laser is preferably >10 kHz with very low energy per pulse in order not to damage any illuminated materials. The beam 17 passes through a first beam expander, comprising divergent and convergent lenses 19, 21, which magnifies the beam's diameter to a value of 6 mm. This beam is incident on a refractive beam transformer 22 that converts the beam's Gaussian profile to a substantially top-hat, or rectangular, distribution, the output beam also being collimated. Gaussian-to-rectangular beam transformers are commercially available from such companies as Molecular Technology GmbH. The output beam of the transformer 22 is incident on a second beam expander, also comprising a divergent lens 24 followed by a convergent lens 26, with a much larger magnification factor that produces a collimated output beam with a diameter of 60 mm across its central uniform part. This beam is directed at a large mirror 28 that reflects it towards a mask 34 held in a support (not shown in the figure) so that the reflected beam 29 illuminates the mask 34 at an angle, $\theta_i=25°$ in the xz plane and at ~0° in the yz plane. The mirror 28 is mounted to a stage 30 having motorized actuators 32 under computer control that enable the angle of the beam 29 on the mask to be adjusted by up to ±5° in the xz plane. A shutter 18 is included in the optical system that allows the beam 17 to be blocked before the subsequent optics.

The mask 34 bears a grating pattern 36 that has an area of 20 mm×20 mm and comprises alternate transparent lines and opaque spaces formed using conventional mask writing technology in a layer of chrome on a fused silica substrate. The parallel lines and spaces of the grating 36 have a period of 0.5 µm and are oriented parallel with the x axis. Below the mask 34 is a silicon wafer 38 that has been coated with a 0.5 µm thick layer of a standard i-line sensitive photoresist. The wafer 38 is held by a vacuum chuck 40 that is mounted to a stage system 42 that integrates z-axis actuators (not explicitly shown in the diagram since such mechanisms are well known in the art) that enable the separation and tilt of the wafer 38 to be adjusted with respect to the mask 34. Using these actuators and, for example, thickness reference gauges, the separation of the wafer 38 from the mask 34 is adjusted to ~40 µm across the surface of the wafer 38.

Exposure proceeds by opening the shutter 18 and then rotating the mirror 28 so that the angle of incidence of the beam 29 illuminating mask 34 is scanned through the required range during the duration of the exposure. The preferred angular range using a uniform intensity distribution across the range (which may be obtained using uniform speed of mirror rotation) may be determined by inserting the respective values for the parameters concerned (p=0.5 µm, $\theta_i=25°$, d=40 µm and λ=355 nm) into equs. (3), (4) and (7), from which $\Delta\theta\approx2°$, or may be instead determined using computer simulation methods as described above.

In the yz plane the angle of the beam 29 illuminating the mask 34 remains constant during the exposure, so the angular distribution of the light rays illuminating the mask 34 in this plane satisfies the condition of equ. (9).

At the end of exposure the shutter 18 is closed. The duration of the exposure (or speed of angular scan) is optimized with respect to the intensity of the illumination beam 29 and the photoresist process using standard procedures that include conducting a series of exposures with different exposure doses and evaluating the resulting grating patterns with period 0.25 µm printed in the photoresist after their development.

Non-uniform intensity distributions over the same or different ranges of angles, such as a Gaussian distribution, may alternatively be generated using the apparatus of this embodiment by, for example, varying the power of the output beam of the laser 15 during an angular scan at a constant speed, or by varying the rotation speed of the mirror 28 whilst keeping the power of the beam 28 constant. For such non-uniform distributions the angular range required is preferably determined by computer simulation of the time-integrated intensity distribution exposing the wafer 38.

In the above-described first embodiment of the invention, the light in the beam 29 illuminates the grating 36 with a range of angles of incidence in a sequential manner wherein the light in the beam 29 has a substantially uniform angle of incidence and the angle of the beam 29 is changed during the exposure. It should be understood that the manner for illuminating the grating 36 with light over a range of angles of incidence that is exemplified by this embodiment may be equivalently achieved using many alternative combinations and configurations of light source, optical and mechanical components, so is in no way restricted to the particular selection of source, beam-collimating optics and beam-deflecting elements selected here. In one possible variant, the angular scan of the beam with respect to the mask is instead performed by tilting the mask and wafer sub-system, as a unit, with respect to a stationary beam.

Figure 12:
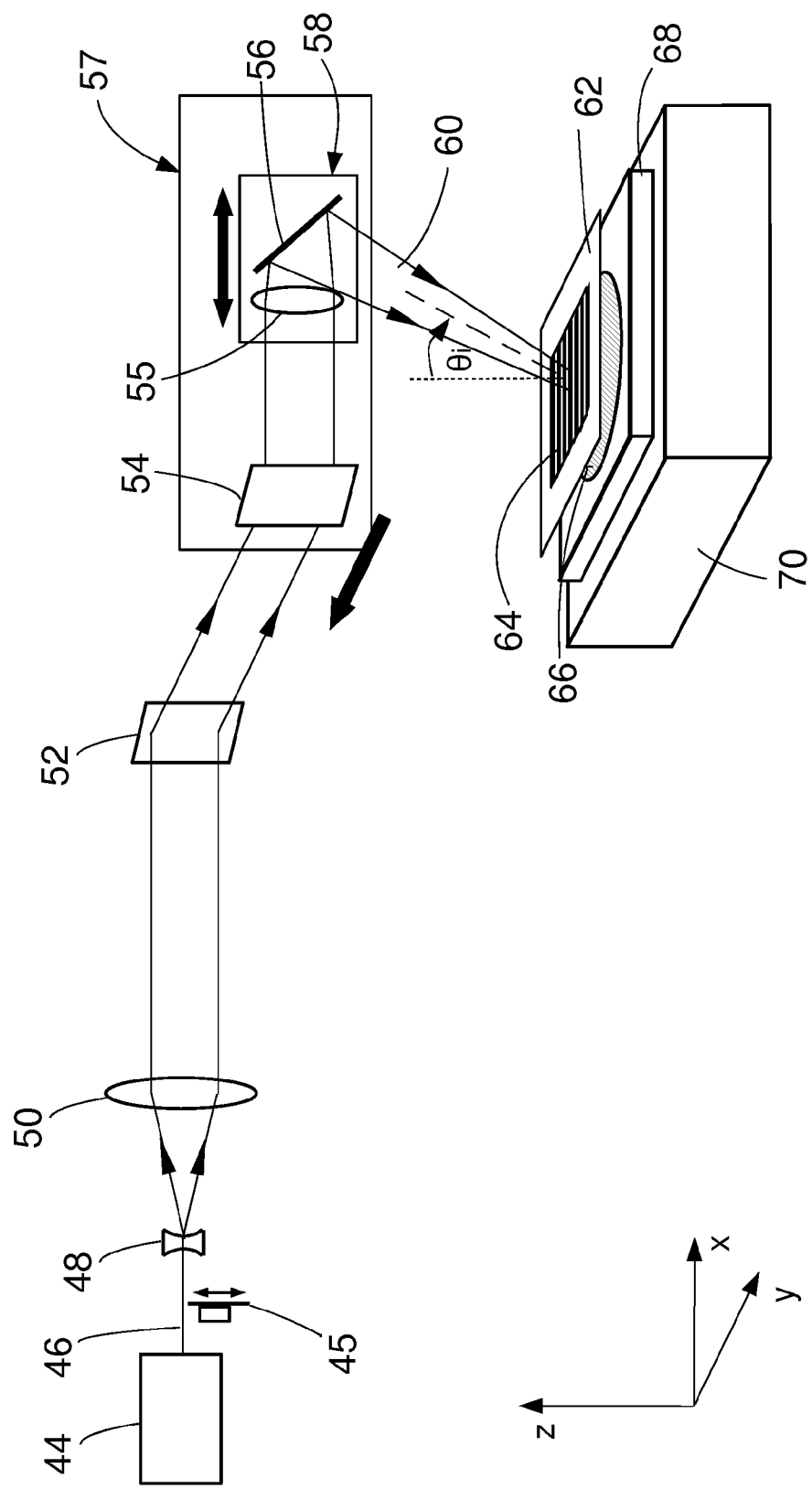
FIG. 12 illustrates a second embodiment of the present invention in which a grating is exposed to a range of angles of illumination by a translational scan of a beam whose light has an angle of incidence that varies across the beam by the range of angles.

With reference now to FIG. 12 which schematically shows a second exemplary embodiment of the invention, a frequency-tripled, diode-pumped solid-state laser 44 produces a collimated beam 46 of wavelength 355 nm, output power ~0.5 W and diameter ~1 mm. The beam 46 is in single transverse mode and is polarized in the xz plane (see axes indicated in the figure). The beam 46 passes first through a first beam expander, comprising divergent and convergent lenses 48, 50, which enlarges the beam's $1/e^2$ radius (radius at which the beam's intensity falls to $1/e^2$ of its axial value) to 20 mm. This beam is then incident on a mirror 52 which reflects it in the y direction towards a first mirror 54 that is part of a module 57 that is mounted to first motorized translation stage of a scanning system (not shown in the figure). The mirror 54 reflects the beam in the x direction towards a cylindrical lens 55 oriented so that the transmitted beam converges in the xz plane. The focal length of lens 55 is ~405 mm so that the $1/e^2$ rays (after first integrating the beam's light in the y direction) converge with angles of ~±2.8°. The convergent beam is incident on a mirror 56 that is oriented so that the reflected beam 60 illuminates a mask 62 with a mean angle of incidence of $\theta_i=20°$ in the xz plane and at substantially normal incidence in the yz plane. Both the cylindrical lens 55 and the mirror 56 are components of a sub-module 58 that is mounted to a second motorized stage of the scanning system (also not shown in the figure) which is itself part of the module 57 and also mounted to the first motorized stage. The second motorized stage allows the lens 55 and mirror 56 to be displaced in the x direction with respect to the mirror 54 (as indicated by the thick, double-headed arrow in the figure), whereas the first motorized stage allows the mirror 54, lens 55 and mirror 56 to be displaced in the y direction with respect to the mirror 52 (as indicated by the thick single-headed arrow in the figure). The two motorized stages are thereby configured and are under computer control for generating a raster scan of the beam 60 across the mask 62, the scan passes of the beam 60 being in the x direction and the scan steps in the y direction (raster scanning systems are well known in the art, so are not described and illustrated in more detail here). The scan passes of the raster pattern might alternatively be in the y direction and the scan steps in the x direction to achieve the same effect (in fact, two-dimensional scan patterns other than raster may also be used to achieve the same effect). The optical path length of the beam 60 from the cylindrical lens 55 to the mask 62 is arranged to be ~20 cm in order that the elliptical cross-section of the beam 60 illuminating the mask 62 has dimensions approximately 40 mm×20 mm at its $1/e^2$ intensity contour. Other optical path lengths may be used but the mask should not be close to the focal plane of the lens 55 because the angles of the beam's rays can deviate near the focal plane and too high a beam intensity can cause damage. Optical path lengths between then lens 55 and mask 62 that are larger than the focal length of lens 55 may also be employed, which would result in the mask 62 being illuminated by a divergent beam with the required range of angles rather than a convergent one. The mask 62 bears a pattern 64 consisting of parallel lines and spaces with a period 0.5 µm, the lines being oriented parallel to the x axis. Below the mask 62 is a wafer 66 coated with a layer of standard i-line sensitive photoresist on a vacuum chuck 68 that is mounted to stage 70 incorporating z-axis actuators (not shown) for adjusting the height of the wafer 66 and its tilt about the x and y axes. Using the actuators and, for example, thickness reference gauges, the wafer 66 is displaced so that it is parallel to the mask 62 and separated from it by a distance of 40 µm. With this separation, the aforementioned angle of incidence for the illumination beam 60 (20°) and the period of the grating in the mask (0.5 µm), the minimum range of angles required to print a stationary pattern on the substrate is, using equs. (3), (4) and (6), ~2.8°. As recommended above, in the case of a Gaussian angular distribution, this range of angles should preferably correspond to the width at the ±σ values. Based on this, the angular width of the beam where the intensity falls to $1/e^2$ of its central value (which corresponds to the ±2σ width) should be ~±2.8°, which is the convergence angle arranged by the particular selection of beam expander lenses 48, 50 and cylindrical lens 55 identified above. For a more accurate optimization and verification of the angular range needed for the specific requirements of the application concerned, computer simulations and experimental optimizations can additionally or alternatively be performed.

In the yz plane, the beam 60 illuminating the mask 62 is collimated, so the angular distribution of the light rays illuminating the mask 62 in this plane satisfies the condition of equ. (9).

The exposure is performed by raster scanning the beam 60 across the pattern 64 in the mask 62. The step size of the raster scan in the y direction is selected to be 5 mm in order to provide a high uniformity of the integrated exposure density and over the range of angles at all points of the pattern 64 in the mask 62. As for the first embodiment, the exposure density, which in this case is a function of the power in the beam 60, the scan speed and the step-size of the raster pattern, is optimized with respect to the photoresist process by performing a series of exposures onto one or more wafers and subsequent evaluations of the resulting printed grating with period 0.25 µm. In this embodiment of the invention the range of angles of the illumination beam 60 required for illuminating each point of the mask pattern 64 is generated by the range of angles in the convergent exposure beam 60 and the scanning motion of the beam 60, which combine to produce the desired result.

In the above-described second embodiment of the invention, the light in the beam 60 illuminates each point of the grating 64 with a range of angles of incidence in a sequential manner wherein the grating 64 is illuminated by light whose angle of incidence varies across the beam 60 and the beam 60 is translationally scanned with respect to the grating 64. It should be understood that the manner for illuminating the grating 64 with light over a range of angles of incidence that is exemplified in this embodiment may be equivalently achieved using many alternative combinations and configurations of light source, optical and mechanical components, so is in no way restricted to the particular selection of source, beam-forming optics and scanning components selected here. For example, the scanning may alternatively be performed by displacing the mask and wafer sub-system, as a unit, with respect to the beam.

In another variant of this embodiment, a different set of beam-forming components are employed to generate an illumination beam that, in the xz plane, is also convergent with a Gaussian intensity distribution and of similar size in relation to the dimension of the pattern; but, in the yz plane, it is arranged to be collimated with a uniform intensity distribution across the beam and to be as long as the pattern. A beam with such characteristics may be formed using, for example, a diffuser plate that diffuses the beam in one direction (commercially available from such companies as RPC Photonics, Inc.) in combination with other, standard optical components. Using this beam, the illumination of each point of the mask pattern with the required range of angles of incidence for printing the desired pattern is obtained by a single linear scan of the beam in the x direction across the mask.

Figure 13:
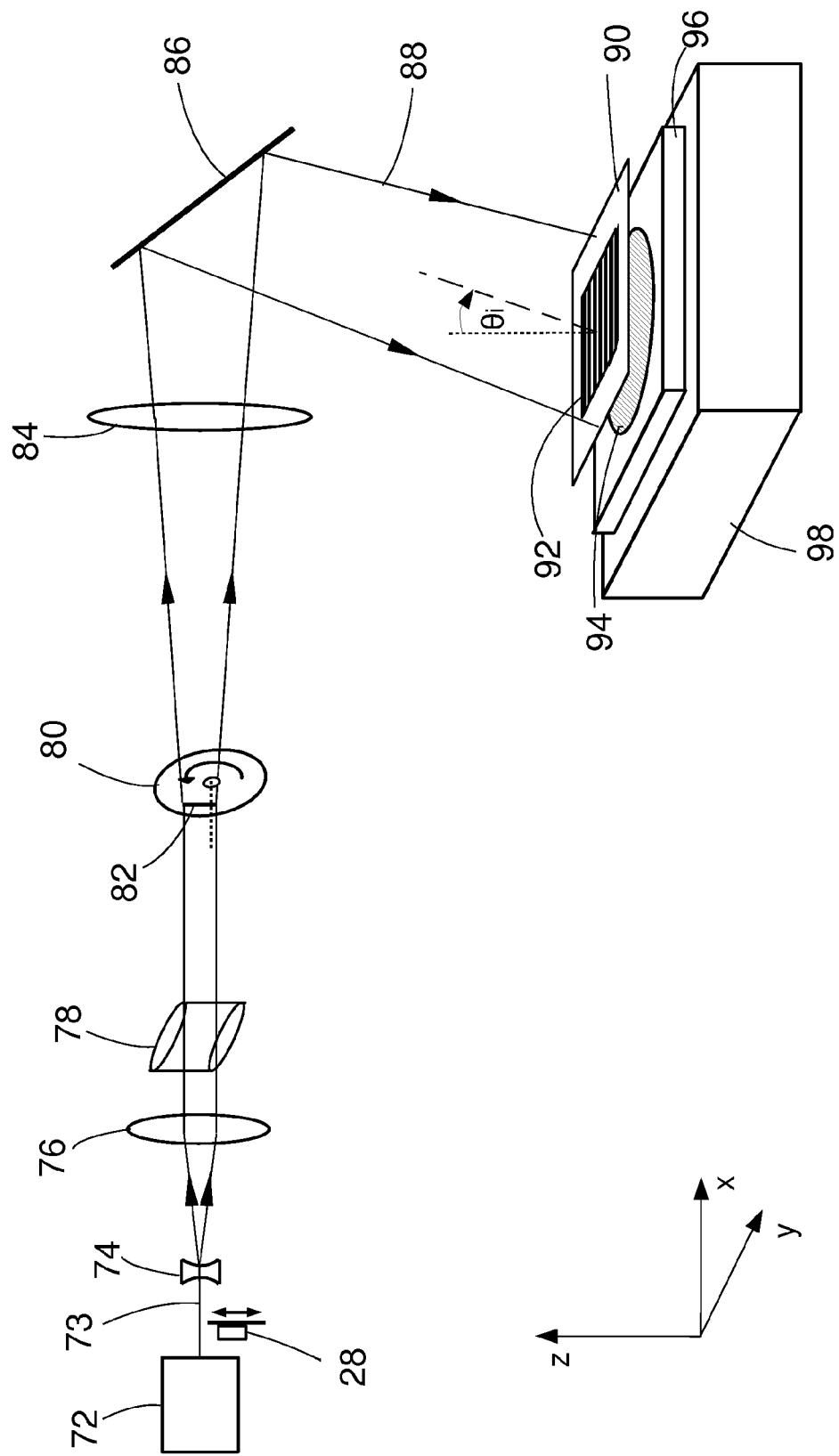
FIG. 13 illustrates a third embodiment of the present invention in which a grating is exposed to a range of angles of illumination by a beam whose light has a range of angles at each point of the beam.

With reference now to FIG. 13 which schematically shows a third exemplary embodiment of the invention, an argon ion laser 72 emits a collimated beam of UV light 73 with wavelength of 364 nm and diameter 2 mm. The beam 73 is in TEM00 mode and is polarized in the xz plane. The beam 73 passes through a beam expander comprising cylindrical divergent and convergent lenses 74, 76 that enlarge the dimension of the beam in the xz plane to form a collimated beam of elliptical cross-section whose $1/e^2$ dimension along its major axis is 34 mm. This beam is incident on a cylindrical lens 78 that has a focal length 100 mm which focuses the light in the yz plane. A diffuser plate 80 is located at a distance of ~75 mm from the cylindrical lens 78 such that the convergent beam from the cylindrical lens 78 forms an elongated strip of light of dimensions of approximately 34 mm×0.5 mm (at its $1/e^2$ intensity contour) on the diffuser plate 80. The diffusing plate, 80, comprises a fused silica substrate with a microstructured surface that scatters the illuminating beam with high transmission efficiency into a narrow cone of angles of ~15°× 15° and with a high uniformity over these angles. Diffusing substrates with such scattering characteristics are commercially available from such companies as RPC Photonics Inc. The diffuser plate 80 is circular and its center is mounted to a motor (not shown in the diagram) which allows the diffuser plate 80 to be rotated about an axis orthogonal to its plane at a speed of e.g. 300 rpm. The cone of scattered light emanating from the rotating diffuser is incident on a collimating lens 84 that has a focal length of 500 mm. In the yz plane the light is substantially collimated by the lens to produce a beam with a diameter in the y direction of ~130 mm. In the xz plane the elongated strip of light illuminating the diffuser plate 80, which has a Gaussian intensity distribution along its length, introduces a range of angles into the illuminating beam after the collimating lens 84, such that at each point of the beam the angles of its rays are distributed in a range ±1.9° (referring to the $1/e^2$ rays) about a mean direction that is parallel to the axis of the lens 84. The central ~100 mm-diameter area of the output beam of lens 84 has a substantially uniform intensity distribution. In the yz plane, the narrow dimension of the strip of light illuminating the diffuser and the long focal length of the lens restricts the range of angles of the light after the lens, in this plane, to ~±0.5 mR (angles at which relative intensity falls to $1/e^2$ of axial intensity). This beam is reflected by a minor 86 that is inclined so that the mean angle of the light in the reflected beam 88 illuminates a mask 90 at an angle of incidence of 15° in the xz plane and at ~0° in the yz plane. The mask 90 bears a grating pattern 92 of area ~50 mm×50 mm comprising parallel lines and spaces with a period 0.45 µm, the lines being oriented parallel to the x axis. Below the mask 90 is a wafer 94, coated with a layer of a standard i-line sensitive photoresist, on a vacuum chuck 96 that is mounted to stage 98 incorporating a mechanism for adjusting the height and tilt of the wafer 94 about x and y axes with respect to the mask 90. Using the height and tilt adjusting mechanism of the stage 98 and, for example, thickness gauges, the wafer 94 is displaced such that it is parallel to the mask 90 and separated from it by a distance of ~50 µm. With this separation, the aforementioned angle of beam 88 on the mask 90 (15°) and the period of the grating 92 (0.45 µm), the minimum range of angles required to print a stationary pattern on the wafer is, using equs. (3), (4) and (6), ~1.9°. As recommended above, in the case of a Gaussian angular distribution, this range of angles should preferably correspond to the width at the ±σ values. Based on this, the angular width of the beam where the intensity falls to $1/e^2$ of its central value (which corresponds to the ±2σ width) should be ~±1.9°, which is the convergence angle produced by the particular arrangement of beam expander lenses 74, 76, diffuser plate 80 and collimating lens 84 selected above. For a more accurate optimization and verification of the angular range needed for the specific requirements of the application concerned, computer simulations and experimental optimizations can additionally or alternatively be performed.

In the yz plane, it is important, as described earlier, that the angular range of the light illuminating the mask 90 does not reduce the contrast of the printed grating. In view of equ. (9) and the Gaussian distribution of the range of angles of the light illuminating the mask 90 in this plane, the ~±0.5 mR determined above for the angular range produced by the particular selection and configuration of cylindrical lens 78, diffuser plate 80 and collimating lens 84 is suitable for printing a desired pattern with a linewidth of 125 nm onto a wafer 94 at a distance of 50 µm from a grating pattern 92 with a period 0.5 µm.

The exposure is performed firstly by activating the rotation of the diffuser plate 80 which serves to continuously displace, when the shutter 28 is open, the resulting coherent speckle pattern across the mask 90 so that the time-integrated exposure across the mask 90 becomes uniform (with the rotation the light transmitted by the diffuser plate is effectively made incoherent). The shutter 28 is then opened for a period of time dependent on the intensity of the illumination beam 88 at the mask 90 and the particular photoresist process so that the photoresist receives the exposure dose necessary for forming the required structures after development. As in the previous embodiments the exposure time should preferably be optimized with respect to the photoresist process by performing a series of exposures onto one or more wafers and subsequently evaluating the resulting printed gratings with period 0.225 µm.

In the above-described third embodiment of the invention, the light in the beam 88 illuminates the grating 92 with a range of angles of incidence in a simultaneous manner wherein the grating 92 is illuminated by light having a range of angles of incidence at each point of the beam 88. It should be understood that the manner for illuminating the grating 92 with light over a range of angles of incidence that is exemplified by this embodiment may be equivalently achieved using many alternative combinations and configurations of light source, optical and mechanical components, so is in no way restricted to the particular selection of source and components selected here.

In another embodiment of the invention that is not illustrated here, but may regarded as a combination of the second and third embodiments, a set of beam forming optics similar to those of the third embodiment are employed to generate a beam whose light at each point of the beam has a range of angles in the xz plane with a Gaussian distribution of intensity across the range of angles, except that a more conventional diffuser with a Gaussian-like scattering profile is employed so that the spatial variation of intensity across the beam illuminating the mask is near-Gaussian rather than uniform. Also, the other beam-shaping optical components are selected so that the size of the beam illuminating the mask is significantly smaller than the size of the mask pattern. A two-axis scanning system similar to that of the second embodiment is employed to scan the beam in a raster pattern (or equivalent) across the mask in order that the pattern therein is uniformly illuminated with the required range of angles to print the desired pattern onto the substrate. Using this embodiment the diffuser does not need to rotate during the exposure.

Whereas the foregoing description of the general concept and detailed embodiments of the present invention have described arrangements of the mask and substrate in which the intermediate medium is air, which is the most practical arrangement with respect to a production process, it should be understood that in other embodiments of the invention, other media with different refractive indices may be alternatively employed. Advantageously, an immersion fluid with a higher refractive index than that of air may be introduced between the mask and substrate in order to print gratings with smaller periods using a given illumination wavelength. If such a material is employed, then the range of angles of illumination required for printing a desired pattern onto a substrate may be estimated using modified versions of the above equations that take into account the refractive index of the intermediate material. The modifications required may be readily determined by a person skilled in the art in light of the present disclosure. Likewise, if computer simulation methods are employed to determine more accurately the required range of angles of illumination, then the higher refractive index of the medium between the mask and substrate should be appropriately taken into account. An immersion fluid may be introduced between the mask and substrate before or after their separation has been adjusted to the required value prior to exposure, and should be carefully removed and cleaned from the mask and photosensitive surface of the substrate after exposure.

Further, whereas the foregoing description of the general concept and detailed embodiments has referred to mask patterns in the form of gratings whose lines are parallel across the pattern and whose period is uniform across the pattern, it should be understood that the invention and embodiments thereof may also be applied to grating patterns whose period varies slightly across the pattern, either in the direction of the grating vector or orthogonal to the vector, or to grating patterns whose lines are not uniformly parallel to a particular direction. The range of angles of illumination required for printing such quasi-periodic patterns should preferably be estimated from the largest value of the period in the grating. As for periodic patterns, computer simulations should preferably be employed to optimize the range.

In addition, whereas the above embodiments state that the beam illuminating the mask is polarized in its plane of incidence on the mask, in other embodiments of the invention the beam illuminating the mask may be polarized in the orthogonal plane or another plane, or may alternatively be circularly or elliptically polarized.

Also, although the light sources shown in the above embodiments are lasers with output wavelengths that are close to that of the i-line of the emission spectrum of a mercury lamp, in order to be compatible with standard i-line photoresists, lasers with other wavelengths that are compatible with other standard photoresists may be alternatively employed. For example, KrF and ArF excimer lasers with output wavelengths of 248 nm and 193 nm respectively, may be employed in other embodiments of the invention, together with standard DUV sensitive photoresists coated on the substrate. In these cases the beam-forming components after the laser would need to be appropriately selected to obtain the required range of angles of incidence of the beam illuminating the photoresist. A light source other than a laser may also be employed for generating a beam of substantially monochromatic light. For example, a discharge lamp, such as mercury or mercury-xenon lamp, with a spectral filter included in the output beam to transmit a narrow line of the emission spectrum may be employed. A narrow-bandwidth LED might also be used. With such sources the subsequent optical components would need to be appropriately designed and selected in order that the beam illuminating the mask has the required range of angles of incidence and sufficient intensity for enabling an acceptable exposure time of the photoresist coated substrate.

In other embodiments the light illuminating the mask may be generated by more than one illumination source, for example, two or more laser sources may be employed for scanning, in the same direction, two or more respective beams across the mask, each illuminating the mask with a range of angles of incidence and the scan passes being partially overlapping so that the time-integrated illumination of the mask pattern has good spatial uniformity.

While the embodiments described above may be considered as preferred embodiments of the invention, it should, of course, be understood that various modifications and changes in form or detail could readily be made without departing from the spirit of the invention. It is therefore intended that the invention should not be limited to the exact forms described and illustrated, but should be constructed to cover all modifications that may fall within the scope of the appended claims.

The invention claimed is:

1. A method for printing a desired periodic pattern of linear features into a photosensitive layer formed on a substrate, which method includes:
   a) providing a mask bearing a mask pattern of linear mask features that are parallel to a first direction, said linear mask features having a period that is twice that of the desired pattern;
   b) arranging the photosensitive layer parallel to the mask and with a separation from the mask pattern;
   c) generating monochromatic light at a wavelength; and
   d) illuminating the mask pattern with said light over a range of angles that lies substantially in a plane parallel to said first direction so that the light at each angle of illumination transmitted by the mask forms Talbot image planes and exposes the photosensitive layer to an angle-dependent transversal intensity distribution, whereby an integration of said distribution over the range of angles prints the desired periodic pattern;
   wherein the range of angles is selected in relation to the wavelength, the separation and the period such that illuminating the mask at an angle that is changed across the range would cause a particular transversal intensity distribution, which initially exposes the photosensitive layer, to displace longitudinally with respect to the layer by at least a distance between successive Talbot image planes that are formed by light at a mean angle of the range of angles.

2. The method according to claim 1, wherein each feature of the mask pattern is simultaneously illuminated by light at each angle over the range.

3. The method according to claim 1, wherein each feature of the mask pattern is sequentially illuminated by light at each an over the range.

4. The method according to claim 1, wherein the features of the mask pattern are illuminated simultaneously.

5. The method according to claim 1, wherein the features of the mask pattern are illuminated sequentially.

6. The method according to claim 1, wherein the light has an intensity distribution over the range of angles of illumination that varies smoothly or abruptly.

7. The method according to claim 1, wherein the light has an intensity distribution over the range of angles of illumination that is uniform or Gaussian.

8. The method according to claim 1, wherein the range of angles of illumination has a mean angle in the range of 10° to 60°.

9. The method according to claim 8, wherein the angular bandwidth of the range of angles of illumination is small in comparison with the mean angle.

10. The method according to claim 1, wherein the range of angles is selected using at least one of an analytical formula, computer simulation and experimental optimization.

11. The method according to claim 1, wherein the linear features in the mask comprise lines of at least one of an opaque material and a phase shifting material.

12. The method according to claim 1, wherein the linear features in the mask comprise lines of a transmitting material whose thickness varies across the feature.

13. The method according to claim 1, wherein there are at least two linear features per period of the mask pattern.

14. The method according to claim 1, wherein a beam of light is formed whose angle of illumination of the mask pattern varies across the beam, and a scanning motion of the beam relative to the mask is provided during the printing of the desired pattern.

15. The method according to claim 1, wherein a beam of light is formed whose angle of illumination of the mask pattern is substantially uniform, and an angle of the beam relative to the mask is arranged to change during the printing of the desired pattern.

16. The method according to claim 1, wherein a beam of light is formed which illuminates the mask pattern with the range of angles at each point of the beam, and the beam is arranged to be substantially stationary with respect to the mask during the printing of the desired pattern.

17. The method according to claim 1, wherein a beam of light is formed that illuminates the mask pattern with a range of angles at each point of the beam and a scanning motion of the beam relative to the mask is provided during the printing of the pattern.

18. The method according to claim 1, which further comprises providing a fluid between the mask pattern and the photosensitive layer.

19. The method according to claim 1, wherein a period of the desired pattern of linear features and the period of the mask pattern of linear features are substantially, but not exactly uniform across the respective patterns.

* * * * *